(12) United States Patent
McLean et al.

(10) Patent No.: US 8,785,076 B2
(45) Date of Patent: Jul. 22, 2014

(54) PORTABLE FUEL CELL SYSTEMS AND METHODS THEREFOR

(75) Inventors: Gerard F. McLean, West Vancouver (CA); Jeremy Schrooten, Mission (CA); Joerg Zimmermann, Vancouver (CA); Mark Petersen, North Vancouver (CA); Paul Sobejko, North Vancouver (CA)

(73) Assignee: Societe BIC, Clichy (FR)

( * ) Notice: Subject to any disclaimer, the term of this patent is extended or adjusted under 35 U.S.C. 154(b) by 50 days.

(21) Appl. No.: 13/527,271

(22) Filed: Jun. 19, 2012

(65) Prior Publication Data

US 2012/0321918 A1 Dec. 20, 2012

Related U.S. Application Data

(63) Continuation of application No. 11/621,533, filed on Jan. 9, 2007, now Pat. No. 8,216,743.

(60) Provisional application No. 60/757,750, filed on Jan. 9, 2006.

(51) Int. Cl.
 *H01M 8/00* (2006.01)
 *H01M 8/04* (2006.01)

(52) U.S. Cl.
 USPC .......................................... 429/515; 429/535

(58) Field of Classification Search
 None
 See application file for complete search history.

(56) References Cited

U.S. PATENT DOCUMENTS

| | | | |
|---|---|---|---|
| 4,360,569 A | 11/1982 | Steyert et al. | |
| 5,723,229 A | 3/1998 | Scheifers et al. | |
| 6,057,051 A | 5/2000 | Uchida et al. | |
| 6,234,347 B1 | 5/2001 | Amron | |
| 6,268,077 B1 | 7/2001 | Kelley et al. | |
| 6,326,097 B1 | 12/2001 | Hockaday | |
| 6,614,206 B1 | 9/2003 | Wong et al. | |
| 6,893,768 B2 | 5/2005 | Kelly et al. | |
| 6,969,545 B2 | 11/2005 | Finamore | |

(Continued)

FOREIGN PATENT DOCUMENTS

| CA | 2330946 A1 | 11/1999 |
|---|---|---|
| CA | 2473491 A1 | 8/2003 |

(Continued)

OTHER PUBLICATIONS

"U.S. Appl. No. 11/535,054, Final Office Action mailed Jul. 29, 2008", 12 pgs.

(Continued)

*Primary Examiner* — Melvin Curtis Mayes
*Assistant Examiner* — Colin W Slifka
(74) *Attorney, Agent, or Firm* — Schwegman Lundberg & Woessner, P.A.

(57) ABSTRACT

A fuel cell system including, among other things, one or more of a fuel cell, a fuel reservoir, a current collecting circuit, a plenum, or a system cover. The fuel reservoir is configured to store fuel, and may include a regulator for controlling an output fuel pressure and a refueling port. A surface of the fuel reservoir may be positioned adjacent a first fuel cell portion. The current collecting circuit is configured to receive and distribute fuel cell power and may be positioned adjacent a second fuel cell portion. The plenum may be formed when the fuel reservoir and the first fuel cell portion are coupled or by one or more flexible fuel cell walls. The system cover allows air into the system and when combined when a fuel pressure in the plenum, may urge contact between the fuel cell and the current collecting circuit.

31 Claims, 8 Drawing Sheets

(56) References Cited

U.S. PATENT DOCUMENTS

| | | |
|---|---|---|
| 6,969,563 B1 | 11/2005 | McLean |
| 7,052,795 B2 | 5/2006 | McLean et al. |
| 7,063,910 B2 | 6/2006 | McLean et al. |
| 7,201,986 B2 | 4/2007 | McLean |
| 7,241,523 B1 | 7/2007 | Arikara et al. |
| 7,474,075 B2 | 1/2009 | McLean |
| 7,563,305 B2 | 7/2009 | Zimmermann |
| 8,216,743 B2 | 7/2012 | McLean et al. |
| 2001/0049045 A1 | 12/2001 | Hockaday et al. |
| 2002/0064698 A1 | 5/2002 | Ren |
| 2002/0076586 A1 | 6/2002 | Tanaka |
| 2002/0197522 A1 | 12/2002 | Lawrence et al. |
| 2003/0054215 A1 | 3/2003 | Doshi et al. |
| 2003/0157379 A1 | 8/2003 | Kambouris et al. |
| 2004/0023082 A1 | 2/2004 | Kelly et al. |
| 2004/0062965 A1 | 4/2004 | Morse et al. |
| 2004/0086755 A1 | 5/2004 | Kalal |
| 2004/0137290 A1 | 7/2004 | Woods et al. |
| 2004/0209136 A1 | 10/2004 | Ren et al. |
| 2005/0008918 A1 | 1/2005 | Nakakubo et al. |
| 2005/0123818 A1 | 6/2005 | Harper et al. |
| 2005/0170676 A1 | 8/2005 | Yuan et al. |
| 2005/0221155 A1 | 10/2005 | McLean et al. |
| 2005/0249994 A1 | 11/2005 | McLean et al. |
| 2005/0250004 A1 | 11/2005 | McLean et al. |
| 2006/0127733 A1 | 6/2006 | Kaschmitter et al. |
| 2006/0127734 A1 | 6/2006 | McLean et al. |
| 2006/0170391 A1 | 8/2006 | Lam |
| 2006/0228612 A1 | 10/2006 | Dong |
| 2006/0237688 A1 | 10/2006 | Zimmermann |
| 2007/0059541 A1 | 3/2007 | Yoshida et al. |
| 2007/0068599 A1 | 3/2007 | Iaconis et al. |
| 2007/0072042 A1 | 3/2007 | Lam |
| 2007/0090786 A1 | 4/2007 | McLean |
| 2007/0141408 A1 | 6/2007 | Jones |
| 2007/0178335 A1 | 8/2007 | Zimmermann |
| 2007/0184330 A1 | 8/2007 | McLean et al. |
| 2008/0038617 A1 | 2/2008 | McLean et al. |
| 2008/0090109 A1 | 4/2008 | McLean |

FOREIGN PATENT DOCUMENTS

| | | |
|---|---|---|
| CA | 2562493 A1 | 10/2005 |
| JP | 2001313047 A | 11/2001 |
| JP | 2003264003 A | 9/2003 |
| JP | 2003331865 A | 11/2003 |
| JP | 2005509246 A | 4/2005 |
| WO | WO-2005009731 A1 | 2/2005 |
| WO | WO-2007079580 A1 | 7/2007 |

OTHER PUBLICATIONS

"U.S. Appl. No. 11/535,054, Non-Final Office Action mailed Dec. 26, 2007", 12 pgs.
"U.S. Appl. No. 11/535,054, Non-Final Office Action with Restriction Requirement mailed Jan. 8, 2009", 12 pgs.
"U.S. Appl. No. 11/535,054, Response filed Mar. 26, 2008 to Office Action mailed Dec. 26, 2008", 16 pgs.
"U.S. Appl. No. 11/535,054, Response filed Oct. 29, 2008 to Final Office Action mailed Jul. 29, 2008", 13 pgs.
"U.S. Appl. No. 11/621,533 , Response filed Nov. 21, 2011 to Non Final Office Action mailed Sep. 29, 2011", 14 pgs.
"U.S. Appl. No. 11/621,533, Examiner Interview Summary mailed Nov. 17, 2011", 3 pgs.
"U.S. Appl. No. 11/621,533, Final Office Action mailed Mar. 1, 2011", 12 pgs.
"U.S. Appl. No. 11/621,533, Non Final Office Action mailed Sep. 29, 2011", 13 pgs.
"U.S. Appl. No. 11/621,533, Non-Final Office Action mailed Jun. 10, 2010", 20 pgs.
"U.S. Appl. No. 11/621,533, Notice of Allowance mailed Mar. 14, 2012", 6 pgs.
"U.S. Appl. No. 11/621,533, Response filed Mar. 1, 2010 to Restriction Requirement mailed Nov. 27, 2009", 13 pgs.
"U.S. Appl. No. 11/621,533, Response filed May 26, 2011 to Final Office Action mailed Mar. 1, 2011", 10 pgs.
"U.S. Appl. No. 11/621,533, Response filed Nov. 10, 2010 to Non Final Office Action mailed Jun. 10, 2010", 18 pgs.
"U.S. Appl. No. 11/621,533, Restriction Requirement mailed Nov. 27, 2009", 6 pgs.
"U.S. Appl. No. 11/891,637 , Response filed Sep. 19, 2011 to Non Final Office Action mailed Mar. 18, 2011", 8 pgs.
"U.S. Appl. No. 11/891,637, Final Office Action mailed Oct. 31, 2011", 9 pgs.
"U.S. Appl. No. 11/891,637, Non Final Office Action mailed Mar. 18, 2011", 8 pgs.
"U.S. Appl. No. 11/891,637, Response filed Feb. 25, 2011 Restriction Requirement mailed Dec. 16, 2010", 10 pgs.
"U.S. Appl. No. 11/891,637, Restriction Requirement mailed Dec. 16, 2010", 10 pgs.
"Canadian Application Serial No. 2,636,473, Amendment Filed Jan. 5, 2012", 5 pgs.
"Chinese Application Serial No. 200780007550.4, Office Action mailed Mar, 1, 2010", (w/ English Translation), 11 pgs.
"Chinese Application Serial No. 200780007550.4, Office Action mailed Dec. 9, 2011", (w/ English Translation), 11 pgs.
"Chinese Application Serial No. 200780007550.4, Response filed Mar. 7, 2011 to Office Action mailed Dec. 21, 2010", (w/ English Translation of Amended Claims), 12 pgs.
"Chinese Application Serial No. 200780007550.4, Response filed Jul. 16, 2010 to Office Action mailed Mar. 1, 2010", (w/ English Translation of Amended Claims), 13 pgs.
"Chinese Application Serial No. 200780007550.4, Response filed Feb. 21, 2012 to Office Action mailed Dec. 9, 2011", 12 pgs.
"Chinese Application Serial No. 200780007550.4, Second Office Action mailed Dec. 21, 2010", (w/ English Translation), 11 pgs.
"European Application Serial No. 07701660.8, Office Action mailed Dec. 9, 2011", 4 pgs.
"European Application Serial No. 07701660.8, Response filed Apr. 20, 2012 to Office Action mailed Dec. 19, 2011", 15 pgs.
"European Application Serial No. 07701660.8, Response filed Sep. 22, 2011 to Office Action mailed Mar. 22, 2011", 16 pgs.
"European Application Serial No. 07701660.8, Response filed Oct. 1, 2008", 10 pgs.
"European Application Serial No. 07701660.8, Supplementary European Search Report mailed Mar. 29, 2011", 9 pgs.
"International Application Serial No. PCT/CA2007/000029, International Search Report and Written Opinion mailed Apr. 27, 2007", 11 pgs.
"Japanese Application Serial No. 2008-548913, Voluntary Amendment filed Jan. 8, 2010", 6 pgs.
"Singapore Application Serial No. 200805159-1, Examination Report mailed Aug. 26, 2009", 2 pgs.
Zimmermann, Joerg, "Cellular Reservoir and Methods Related Thereto", U.S. Appl. No. 11/621,501, filed Jan. 9, 2007, 24 pgs.
Zimmermann, Joerg, "Fluid Enclosure and Methods Related Thereto", U.S. Appl. No. 11/473,591, filed Jun. 23, 2006, 34 pgs.
Zimmermann, Joerg, "Refueling Valve for a Fuel Storage System and Method Therefor", U.S. Appl. No. 11/621,542, filed Jan. 9, 2007, 24 pgs.
"U.S. Appl. No. 11/891,637, Response filed Nov. 29, 2011 to Final Office Action mailed Oct. 31, 2011", 4 pgs.
"Chinese Application Serial No. 200780007550.4, Office Action mailed Jul. 3, 2012", (w/ English Translation), 12 pgs.
"Chinese Application Serial No. 200780007550.4, Response filed Sep. 17, 2012 to Office Action mailed Jul. 3, 2012", (w/ English Translation of Pending Claims), 12 pgs.
International Application Serial No. PCT/CA2007/000029, Written Opinion mailed Apr. 27, 2007, 4 pgs.
"Japanese Application Serial No. 2008-548913, Office Action mailed Sep. 18, 2012", (w/ English Translation), 7 pgs.
"Korean Application Serial No. 10-2008-7019524, Amendment filed Jan. 9, 2012", (w/English translation), 20 pgs.
"Canadian Application Serial No. 2,636,473, Office Action mailed Jan. 7, 2013", 2 pgs.

(56) References Cited

OTHER PUBLICATIONS

"European Application Serial No. 07701660.8, Examination Notification Art. 94(3) mailed Mar. 1, 2013", 5 pgs.

"Japanese Application Serial No. 2008-548913, Response filed Jan. 25, 2013 to Office Action mailed Sep. 18, 2012", 8 pgs.

Canadian Application Serial No. 2,636,473, Office Action mailed Aug. 27, 2013, 2 pgs.

Canadian Application Serial No. 2,636,473, Office Action mailed Sep. 30, 2013, 2 pgs.

Japanese Application Serial No. 2008-548913, Office Action mailed Jul. 2, 2013, 8 pgs.

Korean Application Serial No. 10-2008-7019524, Office Action mailed Jun. 5, 2013, 16 pgs.

Korean Application Serial No. 10-2008-7019524, Response filed Sep. 3, 2013 to Office Action mailed Jun. 5, 2013, 26 pgs.

Canadian Application Serial No. 2,636,473, Response filed Jan. 21, 2014, 5 pgs.

European Application Serial No. 07701660.8, Response filed Aug. 27, 2013 to Examination Notification Art. 94(3) mailed Mar. 1, 2013, 51 pgs.

International Application Serial No. PCT/CA2007000029, International Preliminary Report on Patentability mailed Jul. 24, 2008, 6 pgs.

International Application Serial No. PCT/CA2007000029, International Search Report mailed Apr. 27, 2007, 4 pgs.

Japanese Application Serial No. 2008-548913, Response filed Dec. 17, 2014, 6 pgs.

PORTABLE FUEL CELL SYSTEMS AND METHODS THEREFOR

PRIORITY OF INVENTION

This application is a continuation application of U.S. Pat. No. 8,216,743, filed on Jan. 9, 2007, which application claims the benefit of priority under 35 U.S.C. §119(e) to U.S. Provisional Patent Application Ser. No. 60/757,750, filed Jan. 9, 2006, which are herein incorporated by reference in their entirety.

TECHNICAL FIELD

This patent document pertains generally to fuel cells, and more particularly, but not by way of limitation, to a portable or micro-fuel cell system and methods therefor.

BACKGROUND

A fuel cell is an electrochemical energy conversion device that utilizes the reaction of fuel and oxygen to produce electricity. Fuel cells operate continuously as long as fuel is present. When hydrogen is used as the fuel, the only by-product is water vapor. The conversion reaction of the fuel cell occurs electrochemically and the energy is released as a combination of electrical energy and heat. The electrical energy can do useful work directly, while the heat can be dispersed.

Portable electrical devices, such as cellular phones and laptop computers (among others), demand a significant amount of electricity to operate. The primary and optionally secondary batteries that currently provide power to these devices are reaching performance limitations. As such, it is likely that battery sources may not be able to provide the necessary power to future portable devices, which will likely require even greater electrical power needs. Fuel cells are a viable alternative power source to traditional batteries, but are currently limited by their relatively large size, low energy density levels and insufficient power output. These drawbacks of current fuel cells are the result of, among other things, the awkward integration of current fuel cell components and positioning requirements in electrical devices.

It is with this recognition of the foregoing state of the technology that the present subject matter providing a portable fuel cell system that is able to maintain a high energy density and provide sufficient power output within an all-inclusive system has been conceived and is now set forth in the text and drawings associated with this patent document.

SUMMARY

Embodiments of the present subject relate to a fuel cell system. In one example, the fuel cell system includes at least one fuel cell or fuel cell layer including an anode, a cathode, and an electrolyte interposed therebetween; a fuel or a fuel storage material; a fuel reservoir including at least one surface positioned adjacent a first portion of the at least one fuel cell or fuel cell layer in which the fuel reservoir is configured to store the fuel or the fuel storage material; a current collecting circuit contacting a second portion of the at least one fuel cell or fuel cell layer in which the current collecting circuit is configured to receive and distribute current generated by the fuel cell or fuel cell layer; and a fuel plenum interposed between the at least one reservoir surface and the first portion of the at least one fuel cell or fuel cell layer.

In another example, the fuel cell system includes a fuel reservoir; a system cover; an enclosed region; and at least one fuel cell. The fuel reservoir is configured to store fuel or a fuel storage material. The system cover is configured to be attachable with the fuel reservoir, thereby forming an enclosed region therein. The at least one fuel cell includes one or more flexible walls comprising an anode or a cathode of the fuel cell. The flexible walls are structurally arranged to form a fuel plenum and are supported, when pressurized, by a portion of one or both of the fuel reservoir or the system cover.

Embodiments of the present subject matter also relate to methods of fabricating a fuel cell system. One method includes forming a fuel cell or a fuel cell layer; coupling a fuel reservoir with a first portion of the fuel cell or fuel cell layer such that a fuel plenum is formed therebetween; disposing a current collecting circuit adjacent to a second portion of the fuel cell or fuel cell layer; disposing a system cover having at least one air access port over one or more of the current collecting circuit, the fuel cell or fuel cell layer, or a portion of the fuel reservoir, including positioning the at least one air access port near the second portion of the fuel cell or the fuel cell layer; and coupling the system cover with the fuel reservoir.

Another method includes forming a fuel reservoir configured to store fuel therein; forming a system cover; coupling the system cover with a portion of the fuel reservoir including forming an enclosed region; and disposing at least one fuel cell in the enclosed region including arranging one or more flexible fuel cell walls to form at least one fuel plenum. In various examples, forming the fuel reservoir and system cover includes forming a support for the one or more flexible fuel cell walls.

These and other aspects, advantages, and features of the present systems and methods will become apparent from a consideration of the following description and associated drawings.

BRIEF DESCRIPTION OF THE DRAWINGS

In the drawings, which are not necessarily drawn to scale, like numerals describe similar components throughout the several views. Like numerals having different letter suffixes represent different instances of similar components. The drawings illustrate generally, by way of example, but not by way of limitation, various embodiments discussed in the present patent document.

DETAILED DESCRIPTION

The following detailed description includes references to the accompanying drawings, which form a part of the detailed description. The drawings show, by way of illustration, specific embodiments in which the present systems and methods may be practiced. These embodiments, which are also referred to herein as "examples," are described in enough detail to enable those skilled in the art to practice the present systems and methods. The embodiments may be combined, other embodiments may be utilized, or structural and logical changes may be made without departing from the scope of the present systems and methods. The following detailed description is, therefore, not to be taken in a limiting sense, and the scope of the present systems and methods are defined by the appended claims and their equivalents.

In this document, the terms "a" or "an" are used to include one or more than one, and the term "or" is used to refer to a nonexclusive or unless otherwise indicated. In addition, it is to be understood that the phraseology or terminology employed herein, and not otherwise defined, is for the purpose of description only and not of limitation. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference should be considered supplementary to that of this document; for irreconcilable inconsistencies, the usage in this document controls.

If they are going to be used to power electrical devices, such as cellular phones, satellite phones, laptop computers, computer accessories, displays, personal audio or video players, medical devices, televisions, transmitters, receivers, lighting devices including outdoor lighting or flashlights, electronic toys, power tools or any device conventionally used with batteries, it is desirable and even necessary for fuel cell systems to occupy only a small volume of the overall electrical device volume, maintain high energy density, and provide sufficient power output. However, current fuel cell systems are either too large to be use in the electrical devices or fail to maintain the high energy density and provide the energy required to power the electrical devices for a sufficient period of time. Advantageously, the present subject matter provides a fuel cell system that is able to maintain a high energy density and provide sufficient power output, yet still occupy a relatively small volume of the overall electrical device volume. In addition, the present fuel cell systems may operate passively, requiring no pumps, valves or heaters, and may instantly startup without having to rely on any supplemental battery or other power source.

Figure 1:
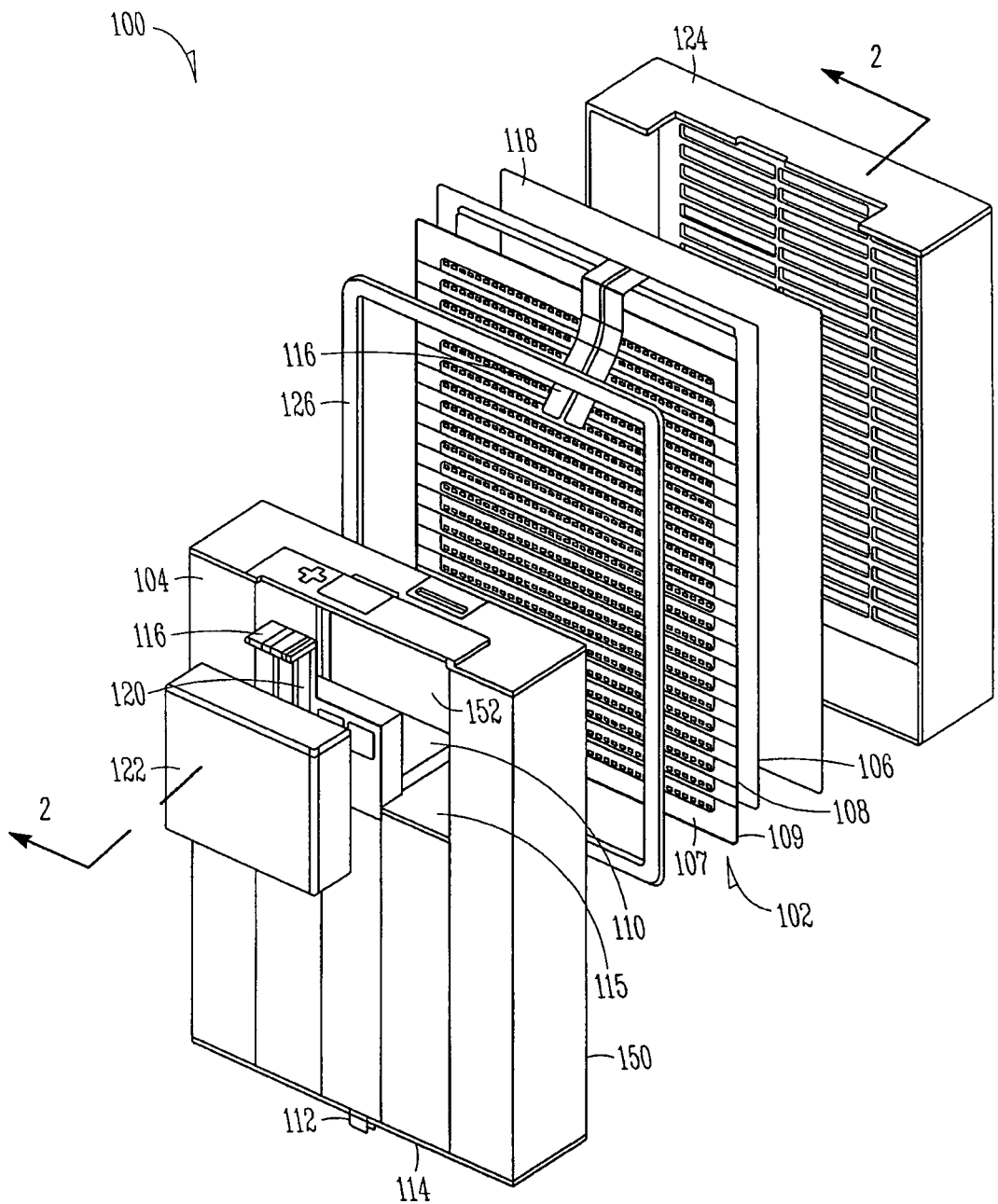
FIG. 1 illustrates an exploded view of a fuel cell system, as constructed in accordance with at least one embodiment.

Referring now to the drawings, particularly to FIG. 1, there is illustrated a fuel cell system 100, including, among other things, a fuel cell layer 102 and a fuel reservoir (e.g., a fuel tank) 104. The fuel cell layer 102 includes one or more fuel cells each comprising an anode 107, a cathode 108, and an electrolyte 109 (e.g., an ion-exchange membrane) interposed therebetween. The fuel cell layer 102 utilized in the system 100 may be a planar fuel cell, such as the fuel cell layer discussed in commonly owned Mclean et al., U.S. patent application Ser. No. 11/047,560, entitled "ELECTROCHEMICAL CELLS HAVING CURRENT-CARRYING STRUCTURES UNDERLYING ELECTROCHEMICAL REACTION LAYERS," filed on Feb. 2, 2005, published as US Patent Pub. 2005/0250004 and issued as U.S. Pat. No. 7,632,587, the disclosure of which is incorporated herein by reference in its entirety. In the fuel cell system 100, the cathode 108 of each cell is supplied with an air containing oxygen as an oxidizing agent, and the anode 107 of each cell is supplied with a fuel, such as hydrogen.

The fuel reservoir 104 may comprise a cellular fuel tank, such as is discussed in commonly-owned Zimmermann, U.S. patent application Ser. No. 11/621,501, entitled "CELLULAR RESERVOIR AND METHODS RELATED THERETO," filed even date herewith and published as U.S. Patent Pub. 2007/0178335, or as is discussed in commonly-owned Zimmermann, U.S. patent application Ser. No. 11/473,591, entitled "FLUID ENCLOSURE AND METHODS RELATED THERETO," filed on Jun. 23, 2006 and issued as U.S. Pat. No. 7,563,305, the disclosures of which are incorporated herein by reference in their entirety. The fuel reservoir 104 encloses a fuel, such as hydrogen, or a fuel storage material, such as a hydrogen storage material as is discussed in commonly-owned Zimmermann, U.S. patent application Ser. No. 11/379,970, filed on Apr. 24, 2006, and published as U.S. Patent Pub. 2007/0295617 the disclosure of which is incorporated herein by reference in its entirety. In one example, the hydrogen storage material includes a metal hydride. The hydrogen storage material may store hydrogen using one or both of physisorption or chemisorption techniques. In another example, the fuel storage material is comprised of polymer enhanced metal hydride wafers, as discussed in commonly owned U.S. patent application Ser. No. 11/379,970.

In some embodiments, the fuel reservoir includes a fluid enclosure in which a structural filler within the enclosure supports the stress applied by the internal fluid pressure rather than having that pressure be fully supported by the enclosure wall as is the case for traditional fluid enclosures. The enclosure may include a structural filler with an outer enclosure wall conformably coupled to it. Since the outer enclosure wall bonds to the structural filler, the fluid pressure applied to the enclosure is fully supported as isostatic tensile stress in the structural filler. The only significant stress that the outer enclosure wall experiences may be due to straining of the structural filler. The burst pressure of the enclosure is therefore limited to the ultimate tensile strength of the structural filler or the bond between the structural filler and the outer enclosure wall. This architecture allows compact, lightweight, and conformable fluid enclosures to be built that can support significant internal pressures without the encumbrance of thick enclosure walls.

As used herein, "structural filler" refers to a material with a sufficient tensile strength to withstand the internal pressure of a fluid enclosure, when pressurized with a fluid. Structural fillers may be solid. Structural fillers may include metallic or plastic lattices, composite hydrogen storage materials, clathrates, nano-structured carbon foams, aerogels, zeolites, silicas, aluminas, graphite, activated carbons, micro-ceramics, nano-ceramics, boron nitride nanotubes, borohydride powder, palladium-containing materials or combinations thereof, for example.

As used herein, "conformably coupled" refers to forming a bond that is substantially uniform between two components that are attached in such as way as to chemically or physically bind in a corresponding shape or form. A structural filler may be conformably coupled to an outer enclosure wall, for example, in which the outer enclosure wall chemically or physically binds to the structural filler and takes its shape.

As used herein, "outer enclosure wall" refers to the outermost layer within a fluid enclosure that serves to at least partially slow the diffusion of a fluid from the fluid enclosure. The outer enclosure wall may include multiple layers of the same or differing materials. The outer enclosure wall may include a polymer or a metal, for example.

As used herein, "composite hydrogen storage material" refers to active material particles mixed with a binder, wherein the binder immobilizes the active material particles sufficient to maintain relative spatial relationships between the active material particles. Examples of composite hydrogen storage materials are found in commonly-owned U.S. patent application Ser. No. 11/379,970, filed Apr. 24, 2006, which published as 2006/0237688, whose disclosure is incorporated by reference herein in its entirety.

As used herein, "occluding/desorbing material" refers to a material capable of absorbing, adsorbing or retaining a substance and further capable of allowing the substance to be removed. The occluding/desorbing material may retain the substance chemically or physically, such as by chemisorption or physisorption, for example. Examples of such a material include metal hydrides, composite hydrogen storage materials, clathrates, etc.

Figure 7:
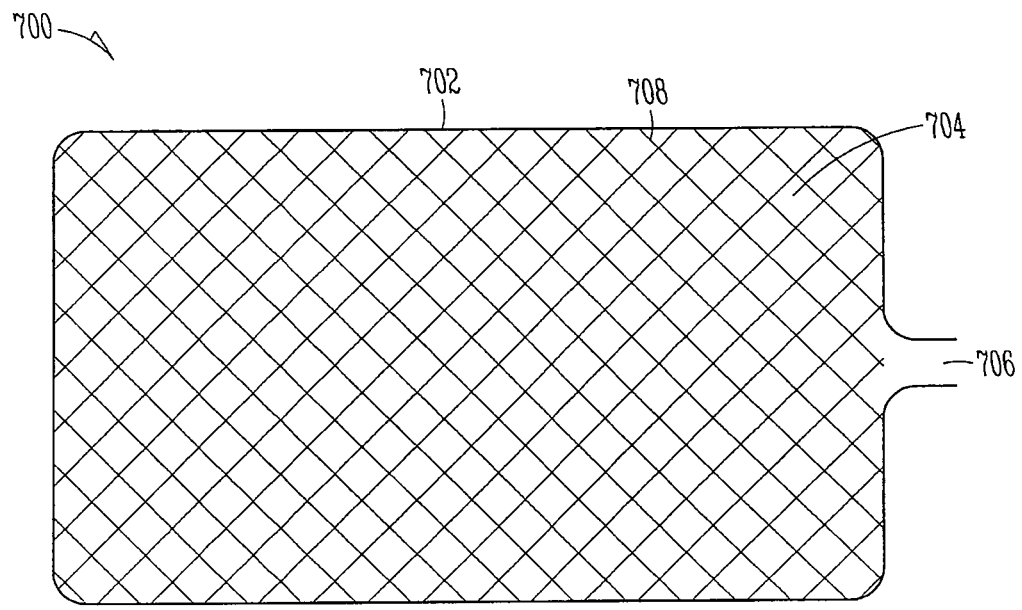
FIG. 7 illustrates a cross-sectional view of a fluid enclosure of an embodiment.

Referring to FIG. 7, a cross-sectional view of a fluid enclosure 700 is shown, according to some embodiments. A structural filler 704 may be surrounded by an outer enclosure wall 702. The structural filler 704 may be conformably coupled to the outer enclosure wall 702, which may be represented by a bond 708. One or more optional features 706 may be utilized. Optional feature 706 may be, for example, a valve, regulator, pressure relief device, flow element, cap, fitting, vent, etc. or some other form of fluidic component associated with a fluid enclosure that can act to communicate between an enclosure and an external device or ambient environment, to observe or control a fluid, or act as a structural component.

The structural filler 704 may include a material with a sufficient tensile strength to withstand the internal pressure of the fluid enclosure 700, when pressurized with a fluid. Structural fillers may be solid. Structural fillers 704 may include metallic or plastic lattices, composite hydrogen storage materials, nano-structured carbon foams, aerogels, zeolites, silicas, aluminas, graphite, activated carbons, micro-ceramics, nano-ceramics, boron nitride nanotubes, borohydride powder, palladium-containing materials or combinations thereof, for example.

The structural filler 704 may include a material capable of occluding/desorbing a fluid, such as a metal hydride. This results in a material with sufficient tensile strength and fluid occluding/desorbing properties, such as composite hydrogen storage material, nano-structured carbon foams, aerogels or zeolites, for example. In addition, the fluid enclosure 700 may include a structural filler 704 and a separate, fluid occluding/desorbing material, such as a metal hydride powder or clathrate. For example, the structural filler 704 may be inert to the fluid being stored and the fluid enclosure may separately include a fluid occluding/desorbing material. If a lattice, the structural filler 704 may include small pores. Pores in the structural filler 704 may be used to hold fluid occluding/desorbing materials, such as metal hydrides or clathrates, for example. A methane clathrate may be used to store methane efficiently at high pressure and could be used in conjunction with a structural filler 704, such as a metal lattice.

The structural filler 704 may be conformably coupled to the outer enclosure wall 702, creating a bond 708. As the force due to internal pressure within the fluid enclosure 700 increases, the load may be transferred directly into a tensile load on the structural filler 704, rather than internal pressure being amplified into tensile load on the outer enclosure wall 702. The internal pressure of the fluid enclosure 700 may be affected by the amount of fluid stored. In addition, the amount of stress applied to the fluid enclosure 700 may be affected by the mechanical stress associated with contacting/releasing a fluid from a storage material, such as hydrogen occluding/desorbing from a metal hydride, for example.

The structural filler 704 may have a continuous, uniform thickness throughout the fluid enclosure 700. Alternatively, the structural filler 704 may include pockets or areas of discontinuous thickness or density, for example. One case may be where an irregularly shaped fluid enclosure 700 calls for more structural support, such as in a corner, the structural filler 704 may be more dense or include a greater portion of the available space within that area of the fluid enclosure 700.

The outer enclosure wall 702 may include a multitude of materials due to the low stress applied to the outer enclosure wall 702. The outer enclosure wall 702 may include a polymer or metal or multiple layers of each, for example. The outer enclosure wall 702 may be polypropylene, Kynar Flex® (vinylidiene fluoride hexafluoropropylene copolymer) (available through Arkema Inc, Philadelphia, Pa.), polyethylene, polyvinylidene fluoride (PVDF), hexafluoropropylene vinylidene fluoride copolymer, cross-linked copolymers, polytetrafluoroethylene (PTFE), perfluoro alkoxy (PFA), thermoplastic polyesters (for example, Nylon™), or combinations thereof, for example. The outer enclosure wall 702 may be formed of the same material as at least a portion of the structural filler 704, for example. The outer enclosure wall 702 may be a sheet or a solution, prior to application. The outer enclosure wall 702 does not have to be rigid or in any pre-formed shape. The outer enclosure wall 702 may act as a barrier to the exit of a fluid from the structural filler 704.

Because the structural filler 704 may be bonded to the outer enclosure wall 702, the stresses induced on the outer enclosure wall 702 become independent of the geometry chosen. In conventional enclosure designs, the geometry of the enclosure strongly dictates the relationship between the stress in the enclosure wall and the internal pressure. If a structural filler 704 is conformably coupled to the outer enclosure wall 702, virtually any geometry of the fluid enclosure 700 may be utilized, so long as the tensile strength of the structural filler 704 and the bond 708 between the structural filler 704 and outer enclosure wall 702 is larger than the internal pressure. The structural filler 704 may be formed into a desired shape before the outer enclosure wall 702 is conformably coupled to it.

The outer enclosure wall 702 may have a uniform or a varying wall thickness, for example. The outer enclosure wall 702 may have a greater wall thickness around optional features 706, for example. The outer enclosure wall 702 may have an average wall thickness of less than about 5000 microns, less than about 1500 microns, less than about 500 microns, less than about 300 microns, less than about 100 microns, less than about 50 microns, less than about 10 microns or less than about 1 micron, for example.

Figure 8:
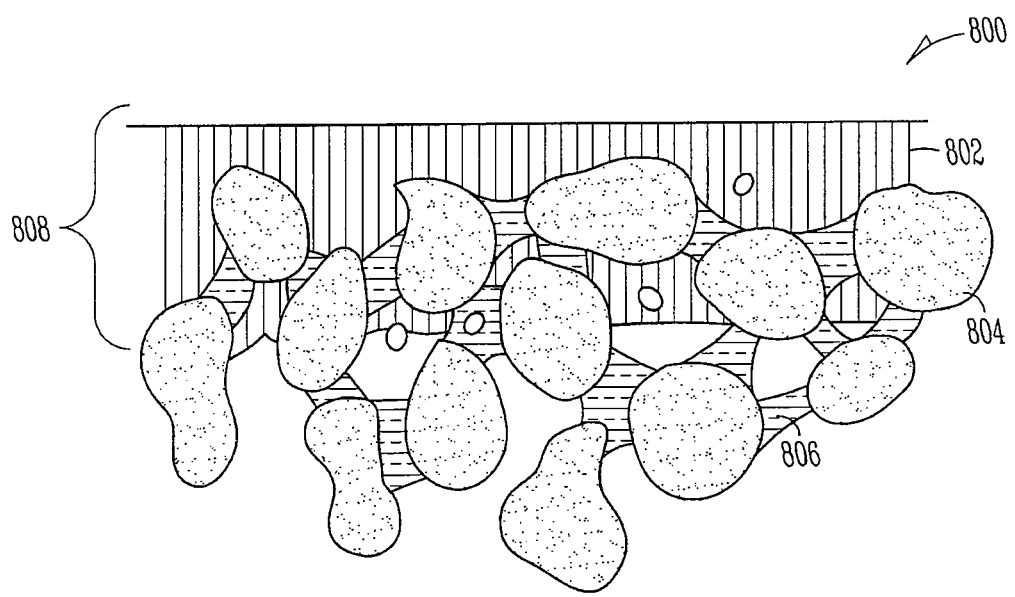
FIG. 8 illustrates a cross-sectional view of a portion of a fluid enclosure of an embodiment.

Referring to FIG. 8, a cross-sectional view of a portion of a fluid enclosure 800 utilizing a composite hydrogen storage material is shown, according to some embodiments. Active particles 804 are immobilized by a binder 806, making up the composite hydrogen storage material, which is an example of a structural filler 704. The outer enclosure wall 802 penetrates within the interface region 808, conformably coupling to the structural filler.

The interface region 808 includes the bond between the structural filler and outer enclosure wall 802 and may vary in thickness. The outer enclosure wall 802 may be uniformly or near uniformly bonded to the structural filler so that a homogeneous or near homogenous interface 808 may be formed, which prevents localized stress concentrations building up at the outer enclosure wall 802. The outer enclosure wall 802 material may be applied to the structural filler and allowed to penetrate the surface, creating a bond in the interface region 808. The interface region 808 may become stronger than the structural filler, so that a failure of the fluid enclosure 800 may be a failure from the structural filler and not from the bond found at the interface 808. The interface region 808 may be less than about 50 microns, about 50-100 microns, about 100-150 microns, about 150-200 microns or more than 200 microns thick, for example.

In some embodiments, the outer enclosure wall may be conformably coupled to the structural filler by a variety of methods. Such methods include spraying, painting, dip coating, inset molding, electrostatic deposition, compression molding, transfer molding, injection molding, thermoset injection molding, extrusion, pultrusion, thermoforming, etc. The wall thickness may be increased by duplicating the coupling process or using a different coupling process in order to create multiple layers. Not only can multiple layers of the outer enclosure wall be applied, but one or more layers of other materials may be added. For example, if a thin outer enclosure wall is formed, fluid may slowly diffuse through the wall. A sealing layer may be applied to prevent such diffusion. Examples of a sealing layer may be a thin metallic layer, such as aluminum, copper, gold or platinum. The outer enclosure wall may be comprised of the same or similar material as the structural filler, or a portion of the structural filler, in order to increase the bond strength, for example. The layers may be heated or sintered after application.

One aspect of this invention provides fuel cell apparatus comprising a plenum enclosed by flexible walls. At least one of the flexible walls comprises a first flexible sheet supporting one or more fuel cells. The fuel cells have anodes accessible from a first side of the first flexible sheet and cathodes accessible from a second side of the first flexible sheet. The apparatus includes an inlet for connecting the plenum to a source of a reactant and an external support structure disposed to limit outward expansion of the plenum.

The term "flexible 2D fuel cell array" is used herein to refer to a flexible sheet which is thin in one dimension and which supports a number of fuel cells. The fuel cells have active areas of one type (e.g. cathodes) that are accessible from one face of the sheet and active areas of another type (e.g. anodes) that are accessible from an opposed face of the sheet. The active areas may be disposed to lie within areas on their respective faces of the sheet (e.g. it is not mandatory that the entire sheet be covered with active areas, however, the performance of a fuel cell may be increased by increasing its active area) There are various constructions which may be used to make flexible 2D fuel cell arrays. The weight of an array of fuel cells can be reduced by making the sheet thin. The efficiency of fuel cells can be improved in some cases by making the sheet thin.

A flexible 2D fuel cell array may be made up of individual unit fuel cells that are arranged two-dimensionally in any of a large number of suitable ways on an area covered by the 2D array. For example, cathode regions of individual fuel cells may be arranged to provide one or more of: one or two or more columns of substantially parallel stripes; shapes distributed at nodes of a two-dimensional lattice configuration (which could be a rectangular, square, triangular or hexagonal lattice, for example and which is not necessarily completely regular); a pattern of shapes distributed in both a width and a length dimension of the area covered by the 2D array (such a pattern may be less regular than a lattice-type pattern); or the like. A flexible 2D fuel cell array may comprise a single sheet of a flexible material having fuel cells formed in or on the sheet.

As illustrated in FIG. 1, the fuel reservoir 104 may comprise a void 152 to house optional components, such as a supplemental energy battery 122 or an electronic conditioning circuit 120. In addition, as discussed in Zimmermann, U.S. patent application Ser. No. 11/621,501, filed on Jan. 9, 2007, published as US Patent Pub. 2007/0178335, and entitled "CELLULAR RESERVOIR AND METHODS RELATED THERETO," the fuel reservoir 104 may comprise an irregular shape (e.g., a non-circular, a non-rectangular, or a non-triangular shape), which substantially conforms to an available volume of an allotted space. The allotted space may be located in, among other things, a cellular phone, a satellite phone, a laptop computer, a computer accessory, a display, a personal audio or video player, a medical device, a television, a transmitter, a receiver, a lighting device including an outdoor light or a flashlight, an electronic toy, or a power tool.

Power from the fuel cell layer 102 may be gathered by a current collecting circuit 106, which collects the current generated by the fuel cell layer 102 and routes it out of the system 100 via a power output connector 116 or alternatively into the conditioning electronics section 120 (e.g., an electronic conditioning circuit). In the example shown, but as may vary, the power output connector 116 is attached to both the current collector circuit 106 and the optional conditioning electronics section 120. The current collecting circuit 106 may be flexible to conform to a shape or location of the fuel cell layer 102 or other fuel cell system component. In one example, the fuel cell system 100 provides a peak power output of up to about 4 Watts, while in other examples, the fuel cell system 100 may provide a peak power output of about 2-3 Watts. In various examples, the average power output of the fuel cell system is between about 0.2-1.8 Watts, such about 0.5-1.5 Watts, about 0.75-1.25 Watts, or about 1 Watt. In various examples, the fuel cell system 100 provides an energy density of about 200-600 Watt-hr/L or more, such as about 250-350 Watt-hr/L or about 300 Watt-hr/L. In various examples, the fuel cell system 100 includes a size of about 25 cubic centimeters or less. In certain examples, the size of the fuel cell system 100 is about 10 cubic centimeter or less.

In various examples, the fuel reservoir 104 includes a refueling port 112 and a pressure regulator 110. The refueling port 112 may be a pressure activated valve that allows a flow of fluid, for example, fluid fuel, into the fuel reservoir 104. In one example, the refueling port 112 includes the type discussed in Zimmermann, U.S. patent application Ser. No. 11/621,542, entitled "REFUELING VALVE FOR A FUEL STORAGE SYSTEM AND METHOD THEREFOR," filed even date herewith, the disclosure of which is incorporated herein by reference in its entirety. In the example shown, the refueling valve 112 is coupled with a lower wall 114 of the fuel reservoir 104.

The pressure regulator 110 may be designed to reduce a fuel reservoir pressure to a more constant, lower pressure that is acceptable to the fuel cell layer 102. In one example, the pressure regulator 110 is integrated with an upper wall 115 of the fuel reservoir 104 and includes one or more of a regulator body, a resilient member, a diaphragm, a regulator valve, or a seal member. In such an example, the diaphragm and the regulator valve may be movingly responsive to a pressure difference between a first chamber pressure and a second chamber pressure.

In the example shown, a fuel plenum 212 (FIG. 2) is created by positioning the fuel cell layer 102 adjacent to at least one surface 150 of the fuel reservoir 104. A perimeter of the fuel reservoir surface 150 adjacent the fuel cell layer 102 may be sealed by a seal member 126, such as a compressive or elastic gasket or an adhesive, thereby forming the fuel plenum 212. In operation of this example, the fuel reservoir 104 is filled with fuel by pressurizing the refueling port 112. The pressure regulator 110 is then used to reduce or maintain the pressure in the fuel plenum 212 to a level sufficient for the operation and movement of the fuel cell layer 102. The pressure in the fuel plenum 212, in turn, urges or forces the fuel cell layer 102 against the current collecting circuit 106, providing contact between such components. In this way, the fuel cell system 100 can then be activated (i.e., the electrochemical reaction between, for example, hydrogen and oxygen can be initiated) simply by exposing the system 100 to ambient air. In an alternative example, the fuel cell layer 102 may be directly bonded to the current collecting circuit 106 such that current can be collected without pressure activation.

Optionally, the fuel cell system 100 may comprise a system cover 124 or a porous protective member 118. The system cover 124 may be utilized to assist the attachment of such things as the fuel cell layer 102 and the fuel reservoir 104. Among other things, the system cover 124 may be constructed of a rigid, but ductile material, such as steel or aluminum. Other examples of suitable materials for the system cover 124 include rigid plastics, such as Ultem® (a registered trademark of General Electric Company) or polyethylene. In various examples, the system cover 124 includes one or more air access ports 206 (FIG. 2) that allow at least partial access of the fuel cell cathode 108 to ambient air. As shown, the system cover 124 is configured to surround the fuel cell layer 102 and may be attached to the fuel reservoir 104 by any physical or chemical means, such as by welding, soldering, brazing, crimping, gluing, thermal adhesive, pressure sensitive adhesive, or one or more mechanical structures (e.g., fasteners or protrusions). The mechanical structure may optionally be releasable.

The porous protective member 118 may provide protection to the fuel cell cathode 108 while still allowing air to flow thereto. In one example, the porous protective member 118 protects the cathode 108 from interferents in the ambient air. In certain examples, the porous protective member 118 may be disposed adjacent to the fuel cell layer 102 on the anode side to provide protection to the anode 107 while still allowing fuel to flow therethrough.

Figure 2:
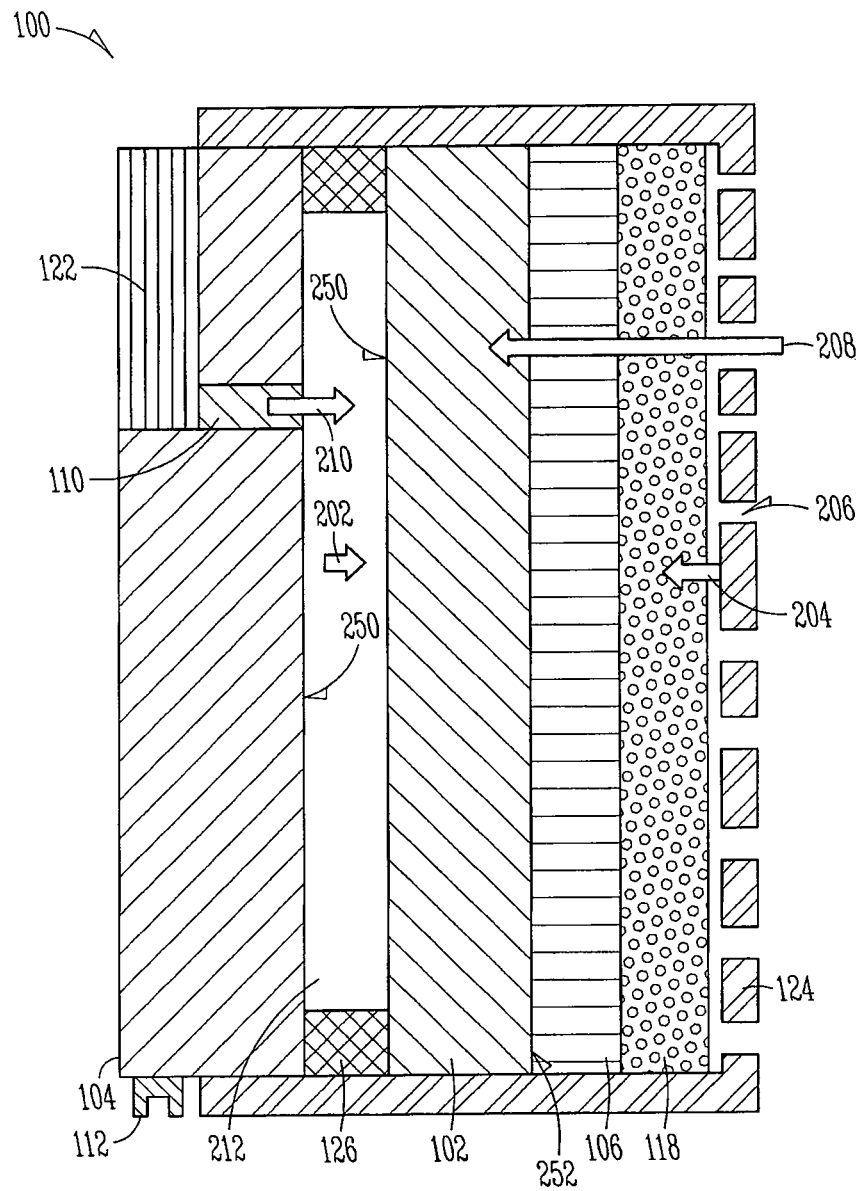
FIG. 2 illustrates a cross-sectional view of a fuel cell system, such as along line 2-2 of FIG. 1, as constructed in accordance with at least one embodiment.

FIG. 2 is a cross-sectional view, such as along line 2-2 of FIG. 1, of a fuel cell system 100 according to one example. In this example, a first fuel reservoir surface 150 contacts a first side of a seal member 126 on a perimeter thereof. A first side 250 of a fuel cell layer 102 contacts a second side of the seal member 126, such that a fuel plenum 212 is thereby created. A second side 252 of the fuel cell layer 102 contacts a current collecting circuit 106. A protective member 118 shields the fuel cell layer 102 and its components from interferents from the environment. A system cover 124 surrounds the fuel cell layer 102 and other components of the fuel cell system 100 (e.g., the protective porous member 118, the current collecting circuit 106, and the fuel plenum 212) and attaches to the fuel reservoir 104. The system cover 124 includes air access ports 206, which allow for ambient air to access the fuel cell layer 102 components, such as the cathode 108 (FIG. 1). Air flows in direction 208 through the air access ports 206 and the porous protective member 118 to provide oxygen to the cathode 108 of fuel cell layer 102.

In this example, as fuel (e.g., hydrogen) flows 210 from the fuel reservoir 104, through the pressure regulator 110, and into the fuel plenum 212, the fuel pressure 202 exerts a force on the fuel cell layer 102 in a direction toward the current collecting circuit 106, providing a contact therebetween. As shown, the mechanical binding of the system cover 124 to the fuel reservoir 104 exerts a cover pressure 204 on the current collecting circuit 106 toward the fuel cell layer 102 (i.e., in the opposite direction of fuel pressure 202), further providing efficient contact between the components of fuel cell system 100.

There are many options for the fuel cell system 100. For instance, in certain examples, the fuel plenum 212 includes a size less than about 1 mm in width (wherein the width is the distance substantially perpendicular to the fuel reservoir 104 and extending from the fuel reservoir 104 to the fuel cell layer 102), while in other examples, the fuel plenum 212 includes a width greater than 1 mm. In certain examples, the current collecting circuit 106 may be disposed underneath the fuel cell layer 102, integrated with the fuel cell layer 102, or within the fuel plenum 212, rather than contacting a second side 252 of the fuel cell layer 102. In such examples, the connection between the fuel cell layer 102 and the current collecting circuit 106 may not be activated by the outward force 202 created through the fuel pressure, but rather through a more positive means of connection (e.g., a bonding process).

Figure 3A:
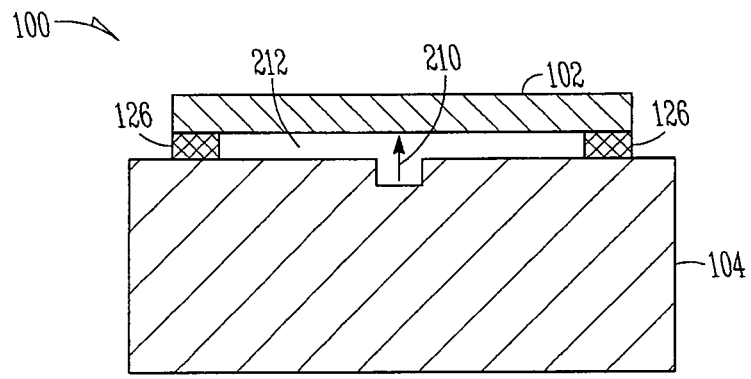
FIGS. 3A-3D illustrate cross-sectional views of portions of a fuel cell system, including one or more fuel cells and a fuel reservoir, as constructed in accordance with various embodiments.
Figure 3B:
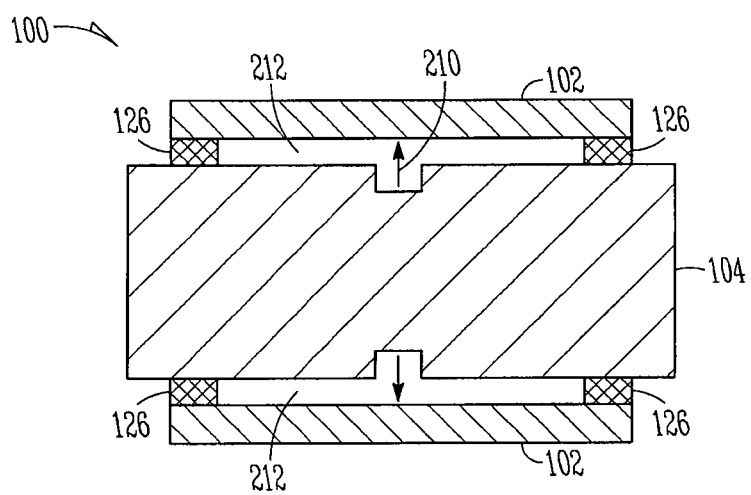
Figure 3C:
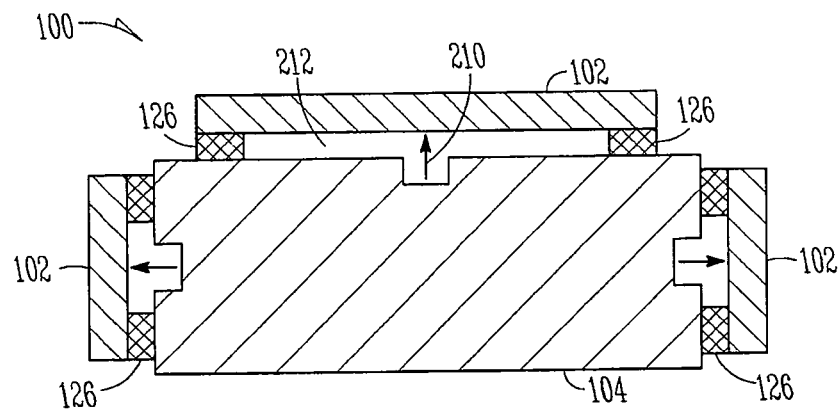
Figure 3D:
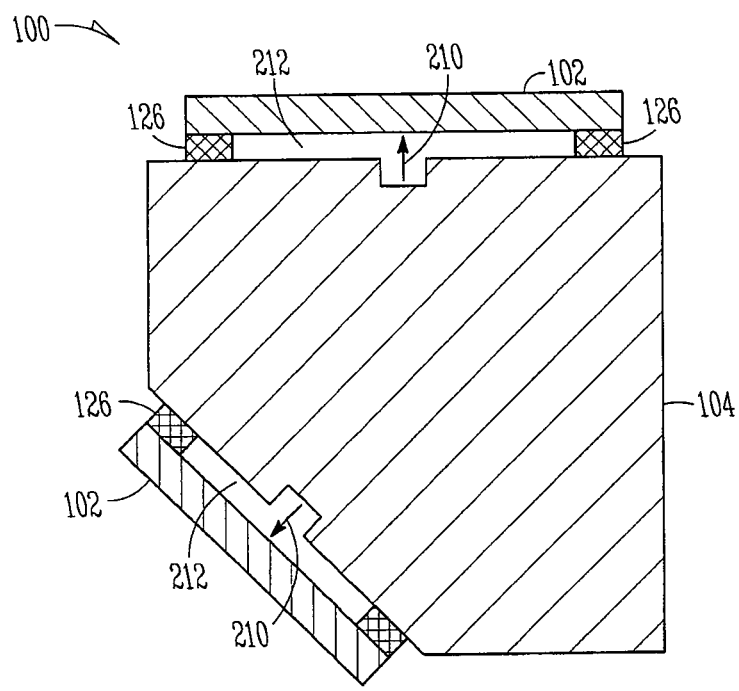

FIGS. 3A-3D illustrate cross-sectional views of portions of a fuel cell system 100, including, among other things, one or more fuel cell layers 102, a fuel reservoir 104, such as a hydrogen fuel reservoir, and one or more seal members 126. In FIG. 3A, one fuel cell layer 102 is disposed adjacent the fuel reservoir 104. In FIG. 3B, two fuel cell layers 102 are oppositely disposed around the fuel reservoir 104. In FIG. 3C, three fuel cell layers 102 are disposed on three separate surfaces of the fuel reservoir 104. In FIG. 3D, two fuel cell layers 102 are disposed on two separate surfaces of an irregularly-shaped (e.g., a non-square or non-rectangular shape) fuel reservoir 104. The fuel cell systems shown in FIGS. 1-2 can utilize the configurations shown in FIGS. 3A-3B, among others. As discussed in association with FIG. 2, one or more seal members 126 may be disposed between the fuel cell layer 102 and the fuel reservoir 104 thereby forming a fuel plenum 212 into which fuel may flow 210 from the reservoir 104.

Figure 4:
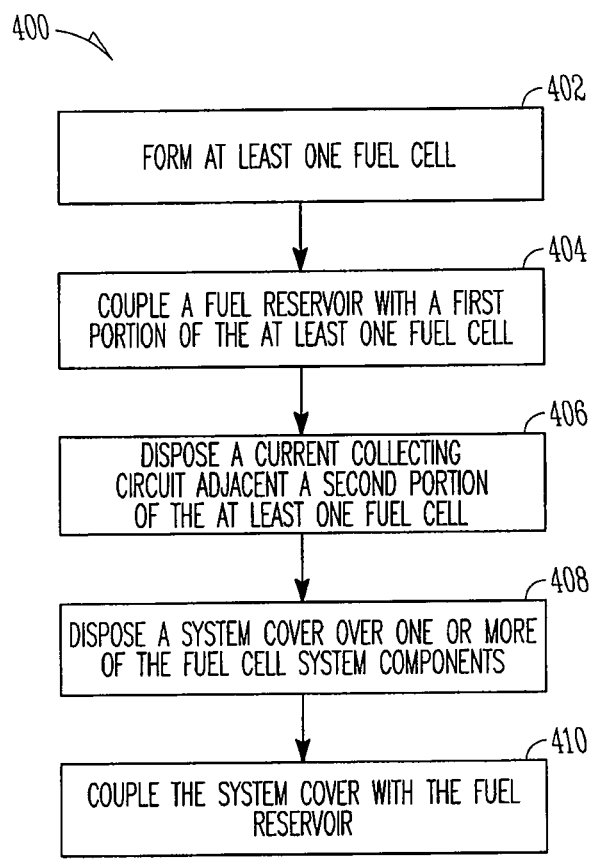
FIG. 4 illustrates a method of fabricating a fuel cell system, such as the fuel cell system illustrated in FIG. 1, as constructed in accordance with at least one embodiment.

FIG. 4 illustrates one method 400 of fabricating a fuel cell system, such as the portable fuel cell system 100 shown in FIG. 1. At 402, at least one fuel cell is formed. In various examples, multiple fuel cells are formed to create a fuel cell layer. Each fuel cell includes an anode, a cathode, and an electrolyte interposed therebetween. At 404, a fuel reservoir is coupled with a first portion of the at least one fuel cell, thereby forming a fuel plenum therebetween. In one example, the fuel reservoir is coupled with the first portion of the at least one fuel cell using a non-conductive adhesive. In another example, a seal member is disposed between the fuel reservoir and the first portion of the at least one fuel cell.

At 406, a current collecting circuit is disposed adjacent to a second portion of the at least one fuel cell. In one example, the current collecting circuit is electrically coupled with a portable electronic device. In another example, the current collecting circuit is electrically coupled with an electronic conditioning circuit.

Further, at 408, a system cover having at least one air access port is disposed over one or more of the current collecting circuit, the at least one fuel cell, or a portion of the fuel reservoir, in which the at least one air access port is positioned near the second portion of the at least one fuel cell. In one example, a protective porous member is disposed between the at least one air access port and the second portion of the at least one fuel cell. At 410, the system cover is coupled with the fuel reservoir. In one example, the system cover is coupled to the fuel reservoir by welding, soldering, brazing, crimping, gluing, thermal adhesive, pressure sensitive adhesive, or one or more mechanical structures (e.g., fasteners or protrusions). The mechanical structure may optionally be releasable.

Figure 5A:
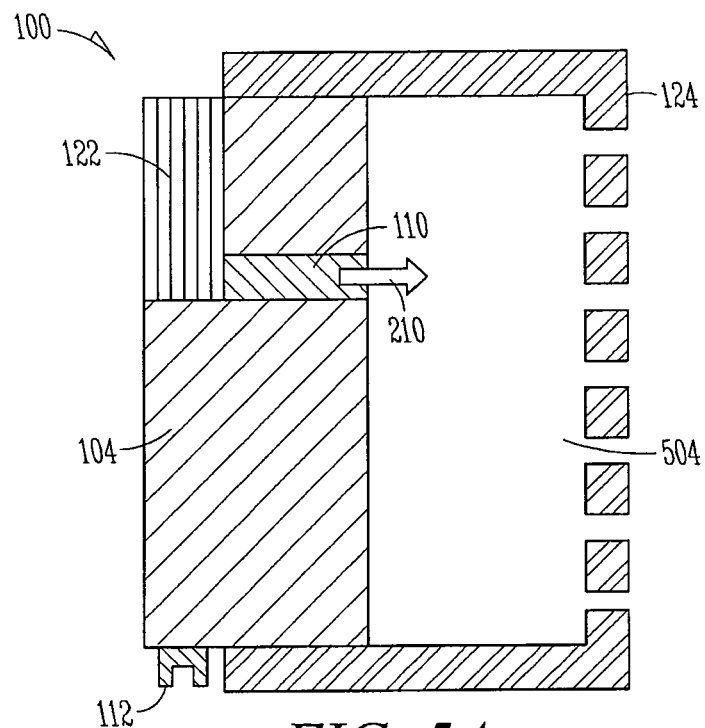
FIGS. 5A-5B illustrate cross-sectional views of portions of a fuel cell system, including one or more fuel cells, a fuel reservoir, and a system cover, as constructed in accordance with various embodiments.
Figure 5B:
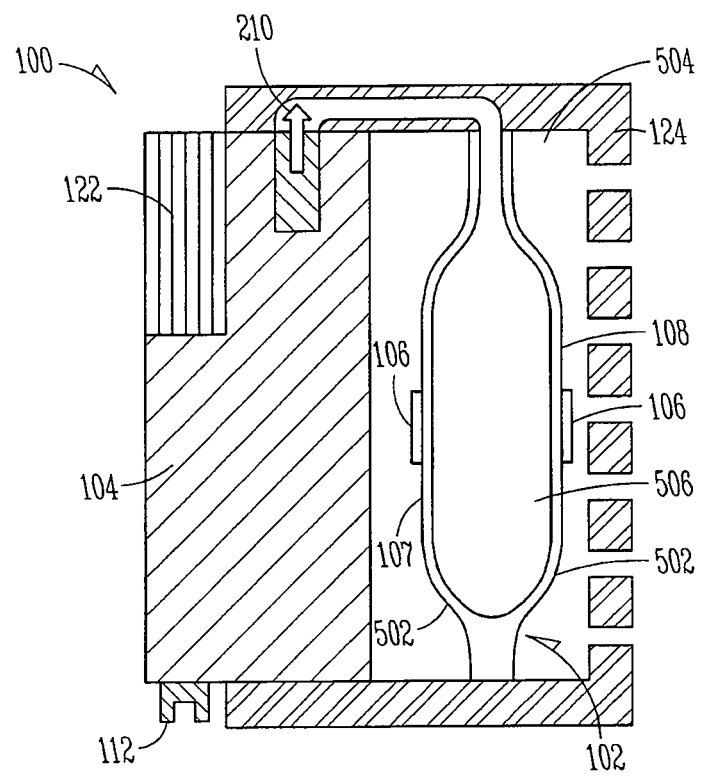

Referring now to FIGS. 5A-5B, there is illustrated, in cross-section, a fuel cell system 100 including, among other things, a fuel cell layer 102 including one or more flexible walls 502, a fuel reservoir 104 configured to store fuel or a fuel storage material, a system cover 124, and an enclosed region 504. The fuel cell layer 102 includes one or more fuel cells each comprising an anode 107, a cathode 108, an electrolyte (not expressly shown) interposed between anode 107 and cathode 108, and a current collecting circuit 106.

The system cover 124 is attachable with a portion of fuel reservoir 104 via, among other things, a weld, a solder, a braze, a crimp, the use of an adhesive, or one or more mechanical structures, thereby forming the enclosed region 504, as shown. The one or more fuel cell layers 102 may be disposed in the enclosed region 504 such that their respective flexible walls 502 are structurally arranged to form at least one fuel plenum 506. The one or more flexible walls 502 are supported by a portion of one or both of the fuel reservoir 104 or the system cover 124. In various examples, the cathode 108 may be accessible from an outside of the flexible wall 502 and exposed to ambient air via air access ports in the system cover 124, while the anode 107 may be accessible from an inside of the flexible wall 502 and exposed to a reactant, such as hydrogen fuel, as is discussed in commonly-owned Mclean et al., U.S. patent application Ser. No. 11/327,516, entitled "FLEXIBLE FUEL CELL STRUCTURES HAVING EXTERNAL SUPPORT," filed on Jan. 9, 2006, and published as U.S. Patent Pub. 2006/0127734 and commonly-owned Mclean et al., U.S. patent application Ser. No. 11/185,755, entitled "DEVICES POWERED BY CONFORMABLE FUEL CELLS," filed on Jul. 21, 2005, published as U.S. Patent Pub. 2007/0090786 and issued as U.S. Pat. No. 7,474,075 the disclosures of which are hereby incorporated by reference in their entirety. The current collecting circuit 106 (integral with the fuel cell layer 102) is configured to receive current generated by the fuel cell layer 102 and distribute such current to, for example, a portable electronic device.

In various examples, a plenum inlet 550 fluidly connects the fuel plenum 506 and the fuel reservoir 104 or ambient air. As reactant enters via the plenum inlet 550, a reactant pressure pressurizes the fuel plenum 506, thus urging the one or more flexible walls 502 of the fuel cell layer 102 toward the supporting portions of one or both of the fuel reservoir 104 or the system cover 124.

Figure 6:
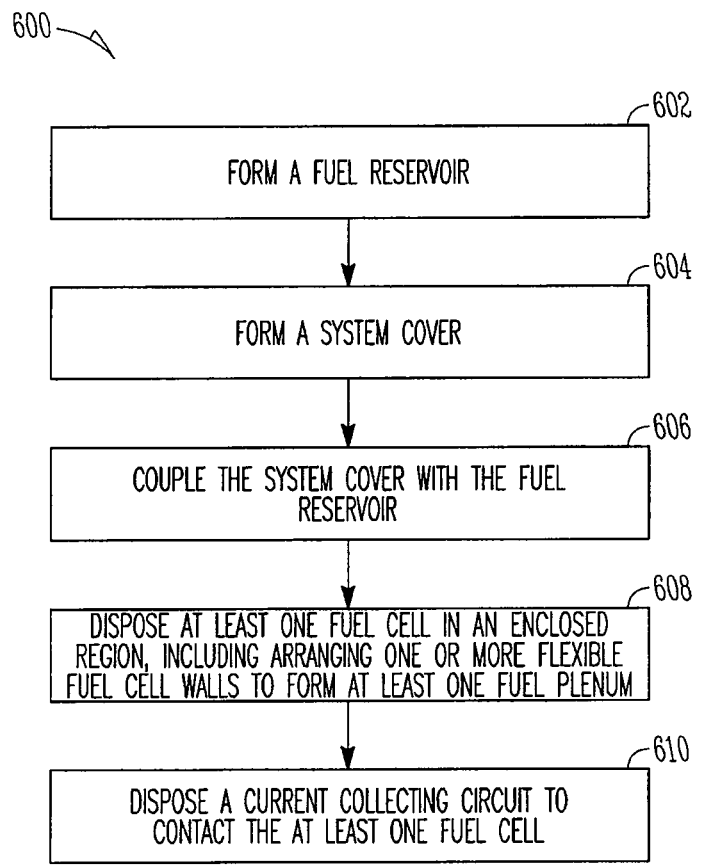
FIG. 6 illustrates a method of fabricating a fuel cell system, such as the fuel cell system illustrated in FIG. 5B, as constructed in accordance with at least one embodiment.

FIG. 6 is a flow diagram illustrating one method 600 of fabricating a fuel cell system, such as the fuel cell system illustrated in FIG. 5B. At 602, a fuel reservoir configured to store fuel therein is formed. At 604, a system cover is formed. At 606, the system cover is coupled with a portion of the fuel reservoir such that an enclosed region is formed therein. In one example, the system cover is coupled with the fuel reservoir via welding, soldering, brazing, crimping, gluing, thermal adhesive, pressure sensitive adhesive, or one or more mechanical structures (e.g., fasteners or protrusions). The mechanical structure may optionally be releasable.

At 608, at least one fuel cell including an anode, a cathode, and an electrolyte interposed therebetween is disposed in the enclosed region. In various examples, multiple fuel cells are formed to create a fuel cell layer. In one example, one or more flexible fuel cell walls comprise one or both of the fuel cell anode or the fuel cell cathode. Accordingly, in another example, disposing the at least one fuel cell into the enclosed region includes arranging the one or more flexible fuel cell walls to form at least one fuel plenum. In various examples, forming the fuel reservoir and the system cover includes forming a support for the one or more flexible fuel cell walls such that when a reactant enters a plenum inlet and pressurizes the fuel plenum, the fuel cell walls expand and conform to a shape of the one or more supports.

At 610, a current collecting circuit is integrated with the at least one fuel cell. In various examples, the current collecting circuit is configured to collect current from the at least one fuel cell and distribute such current to one or more electrical devices, such as portable electrical devices.

Fuel cell systems and methods for their manufacture are provided herein. Among other things, the present systems and methods provide for a fuel cell system providing sufficient power output and a high energy density, all within a relatively small amount of space. The fuel cell system can operate as a stand alone power source or be integrated into an electrical device. Further, the fuel cell system need not rely on pumps, valves or heaters for its operation, saving precious energy and electrical device volume.

It is to be understood that the above description is intended to be illustrative, and not restrictive. For example, the above-described embodiments (and/or aspects thereof) may be used in combination with each other. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, various features may be grouped together to streamline the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate embodiment.

What is claimed is:

1. A fuel cell system comprising:
a fuel reservoir configured to store a fuel therein;
a fuel cell layer in fluidic contact with the fuel reservoir, the fuel cell layer including a flexible wall; and
a fuel plenum formed between the fuel reservoir and the fuel cell layer;
wherein the fuel cell layer is configured to move when the fuel plenum is pressurized with the fuel.

2. The fuel cell system of claim 1, further comprising a system cover configured to at least partially surround the fuel cell layer.

3. The fuel cell system of claim 2, wherein the system cover comprises the housing of an electronic device.

4. The fuel cell system of claim 2, wherein the system cover includes at least one air access port.

5. The fuel cell system of claim 4, wherein the system cover houses one or more of a protective porous member, a current collecting circuit, the fuel plenum, or a portion of the fuel reservoir.

6. The fuel cell system of claim 2, wherein the system cover is attachable to the fuel reservoir and an enclosed region is formed by the attachment of the fuel reservoir to the system cover, and wherein the fuel cell layer is disposed within the enclosure region.

7. The fuel cell system of claim 6, wherein the fuel cell layer includes one or more flexible walls structurally arranged to form the fuel plenum and wherein one or more flexible walls are supported by a portion of one or both of the fuel reservoir or the system cover.

8. The fuel cell system of claim 1, wherein the fuel reservoir comprises a fuel storage material and an outer enclosure wall conformably coupled to the storage material.

9. The fuel cell system of claim 1, further comprising a current collecting circuit in contact with the fuel cell layer, the current collecting circuit configured to receive and distribute current generated by the fuel cell layer.

10. The fuel cell system of claim 9, wherein the current collecting circuit is integral with the fuel cell layer.

11. The fuel cell system of claim 9, wherein the current collecting circuit is configured to distribute the current generated by the fuel cell layer to a portable electronic device.

12. The fuel cell system of claim 11, wherein the portable electronic device includes a cellular phone, a satellite phone, a laptop computer, a computer accessory, a display, a personal audio or video player, a medical device, a television, a transmitter, a receiver, a lighting device, an electronic toy, or a power tool.

13. The fuel cell system of claim 9, wherein the current collecting circuit is configured to distribute the current to an electronic conditioning circuit.

14. The fuel cell system of claim 1, wherein the fuel reservoir comprises a pressure regulator configured to pass the fuel out of the fuel reservoir and a refueling port configured to receive the fuel into the fuel reservoir and wherein the refueling port and the pressure regulator are separate structures.

15. The fuel cell system of claim 1, further comprising a protective porous member disposed adjacent the fuel cell layer.

16. The fuel cell system of claim 1, wherein the fuel plenum is at least partially defined by the fuel cell layer, the fuel reservoir, or a combination thereof.

17. The fuel cell system of claim 1, wherein the fuel reservoir substantially conforms to a volume of an allotted space within an electronic device.

18. The fuel cell system of claim 1, wherein the fuel reservoir includes at least one surface positioned adjacent a first portion of the fuel cell layer.

19. The fuel cell system of claim 1, wherein the fuel plenum is at least partially surrounded by a seal member that provides a seal between the fuel reservoir surface and the first portion of the fuel cell layer.

20. The fuel cell system of claim 1, further includes a supplemental battery.

21. The fuel cell system of claim 1, wherein the fuel is hydrogen.

22. The fuel cell system of claim 1, wherein the fuel reservoir is configured to store a hydrogen storage material.

23. The fuel cell system of claim 22, wherein the hydrogen storage material stores fuel by physisorption or chemisorption.

24. The fuel cell system of claim 23, wherein the hydrogen storage material includes a metal hydride and a binder.

25. The fuel cell system of claim 23, wherein the hydrogen storage material includes a structural filler and an outer enclosure wall of the fuel reservoir is conformably coupled to the structural filler.

26. A method of fabricating a fuel cell system, the method comprising:
    forming a fuel reservoir configured to store a fuel therein;
    forming a fuel cell layer, the fuel cell layer including a flexible wall;
    contacting the fuel reservoir and the fuel cell layer, sufficient to form a fuel plenum positioned therebetween; and
    configuring the fuel reservoir to substantially conform to a volume of an allotted space within an electronic device, and wherein the fuel cell layer is configured to move when the fuel plenum is pressurized with the fuel.

27. The method of claim 26, further comprising forming a system cover having one or more air access ports.

28. The method of claim 27, further comprising coupling the system cover with one or more portions of the fuel reservoir.

29. The method of claim 26, further comprising contacting a current collecting circuit with the fuel cell layer.

30. The method of claim 26, further comprising disposing a protective porous member adjacent the fuel cell layer.

31. The method of claim 26, wherein the fuel reservoir includes a refueling port configured to receive the fuel into the fuel reservoir and a pressure regulator configured to pass the fuel out of the fuel reservoir and wherein the refueling port and the pressure regulator are separate structures.

\* \* \* \* \*